(12) United States Patent
Ogawa et al.

(10) Patent No.: US 9,018,076 B2
(45) Date of Patent: Apr. 28, 2015

(54) SEMICONDUCTOR STORAGE DEVICE AND METHOD OF MANUFACTURING THE SAME

(71) Applicant: Fujitsu Semiconductor Limited, Yokohama (JP)

(72) Inventors: Hiroyuki Ogawa, Yokohama (JP); Akihisa Yamaguchi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 307 days.

(21) Appl. No.: 13/746,304

(22) Filed: Jan. 21, 2013

(65) Prior Publication Data
US 2013/0137239 A1    May 30, 2013

Related U.S. Application Data

(62) Division of application No. 12/914,086, filed on Oct. 28, 2010, now Pat. No. 8,379,428.

(30) Foreign Application Priority Data

Oct. 29, 2009    (JP) .................................. 2009-248587

(51) Int. Cl.
*H01L 21/76*    (2006.01)
*H01L 21/28*    (2006.01)
(Continued)

(52) U.S. Cl.
CPC ........... *H01L 21/28* (2013.01); *H01L 27/10832* (2013.01); *H01L 27/0207* (2013.01); *H01L 27/10882* (2013.01); *H01L 27/10891* (2013.01); *H01L 27/10894* (2013.01)

(58) Field of Classification Search
CPC .................. H01L 21/76224; H01L 21/76264; H01L 27/108; H01L 27/10805; H01L 27/10829; H01L 27/10832; H01L 27/10861
See application file for complete search history.

(56) References Cited

U.S. PATENT DOCUMENTS 5,379,246 A    1/1995    Nogami
5,699,308 A    12/1997    Wada
(Continued)

FOREIGN PATENT DOCUMENTS

JP    61-227292 A    10/1986
JP    11-265995 A    9/1999
(Continued)

OTHER PUBLICATIONS

USPTO, (Kusumakar) Restriction Requirement, Sep. 28, 2012, in parent U.S. Appl. No. 12/914,086.
(Continued)

*Primary Examiner* — Karen Kusumakar
(74) *Attorney, Agent, or Firm* — Westerman, Hattori, Daniels & Adrian, LLP

(57) ABSTRACT

A semiconductor storage device includes: memory cells including a transistor and a capacitor; bit lines; word lines; and sense amplifiers including first and second sense amplifiers, wherein the memory cells includes: a first memory cell group sharing a first auxiliary word line; and a second memory cell group sharing a second auxiliary word line, wherein the word lines includes a first word line coupled to the first auxiliary word line and a second word line coupled to the second auxiliary word line, the first word line is coupled to the first auxiliary word line in a first word line contact region, the second word line is coupled to the second auxiliary word line in a second word line contact region, the bit lines includes first and second bit lines coupled to the first sense amplifier on both sides of the first word line contact region.

6 Claims, 15 Drawing Sheets

(51) Int. Cl.
*H01L 27/02* (2006.01)
*H01L 27/108* (2006.01)

(56) References Cited

U.S. PATENT DOCUMENTS

| | | | |
|---|---|---|---|
| 5,883,826 | A | 3/1999 | Wendell et al. |
| 6,151,244 | A | 11/2000 | Fujino et al. |
| 6,160,730 | A | 12/2000 | Tooher |
| 6,949,830 | B2 | 9/2005 | Owada et al. |
| 6,999,364 | B2 | 2/2006 | Hosokawa et al. |
| 7,323,379 | B2 | 1/2008 | Sinitsky et al. |
| 7,772,634 | B2 | 8/2010 | Asano et al. |
| 2002/0053691 | A1 * | 5/2002 | Leung et al. .......... 257/296 |

FOREIGN PATENT DOCUMENTS

| | | |
|---|---|---|
| JP | 2004-110979 A | 4/2004 |
| JP | 2007-149882 A | 6/2007 |
| JP | 2008-529315 A | 7/2008 |

OTHER PUBLICATIONS

USPTO, (Kusumakar) Notice of Allowance and Fee Due, Nov. 26, 2012, in parent U.S. Appl. No. 12/914,086.

Japanese Office Action mailed Oct. 22, 2013 for corresponding Japanese Application No. 2009-248587, with Partial English-language Translation.

* cited by examiner

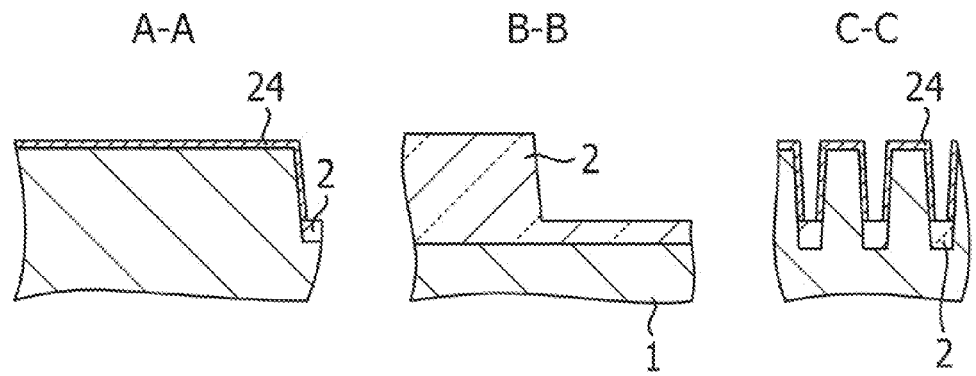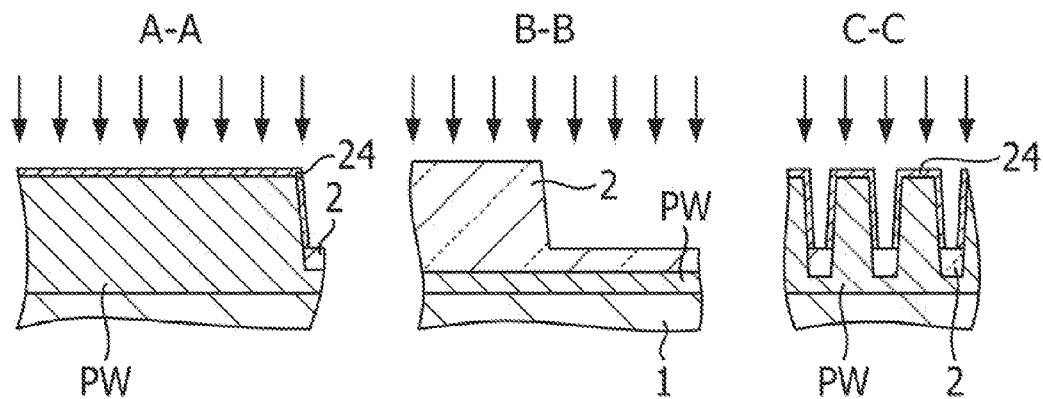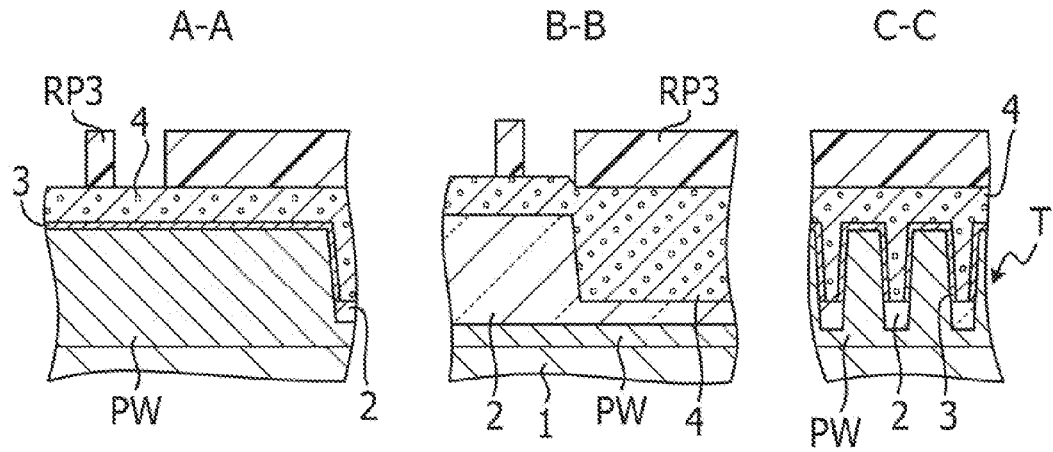

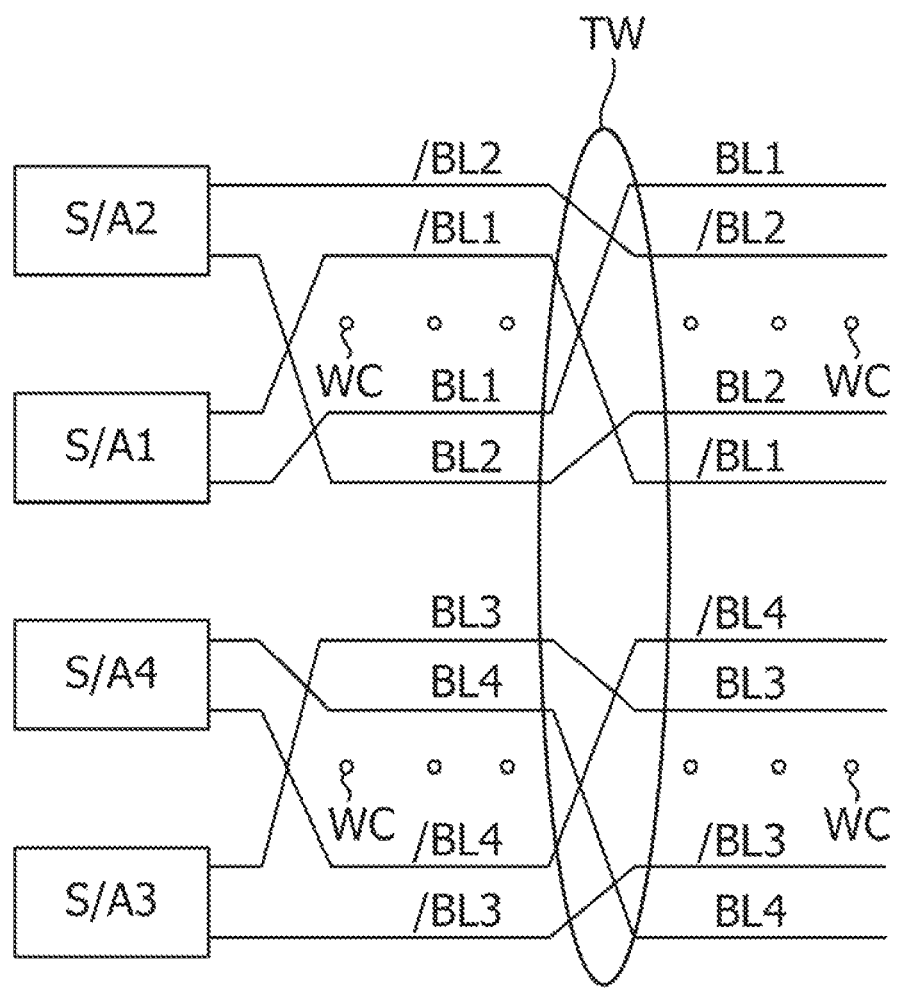

SEMICONDUCTOR STORAGE DEVICE AND METHOD OF MANUFACTURING THE SAME

CROSS-REFERENCE TO RELATED APPLICATIONS

This application is a Divisional of application Ser. No. 12/914,086, filed Oct. 28, 2010, which is based upon and claims the benefit of priority from Japanese Patent Application No. 2009-248587 filed on Oct. 29, 2009, the entire contents of which are incorporated herein by reference.

BACKGROUND

1. Field

Embodiments discussed herein relate to a semiconductor storage device and a method of manufacturing the semiconductor storage device.

2. Description of Related Art

In a dynamic random access memory (DRAM) cell with the 1-transistor/1-capacitor configuration, one current terminal of an access transistor is coupled to a bit line, and the other current terminal of the access transistor is coupled to a storage electrode of a capacitor.

The related art is disclosed in Japanese Laid-open Patent Publication No. H11-265995, etc.

SUMMARY

According to one aspect of the embodiments, a semiconductor storage device is provided which includes: a semiconductor substrate; a plurality of memory cells formed on the semiconductor substrate, each of the memory cells including a transistor and a capacitor; a plurality of bit lines extending in a first direction; a plurality of word lines extending in a second direction which is different from the first direction; and a plurality of sense amplifiers formed in the first direction and including first sense amplifiers and second sense amplifiers, wherein the plurality of memory cells includes: a first memory cell group sharing a first auxiliary word line extending in the second direction as gate electrodes of the transistors; and a second memory cell group sharing a second auxiliary word line extending in the second direction as gate electrodes of the transistors, wherein the plurality of word lines includes a first word line coupled to the first auxiliary word line and a second word line coupled to the second auxiliary word line, the first word line is coupled to the first auxiliary word line in a first word line contact region which is arranged at one end of the first auxiliary word line, the second word line being coupled to the second auxiliary word line in a second word line contact region which is arranged at one end of the second auxiliary word line, the plurality of bit lines includes a first bit line and a second bit line respectively provided on both sides of the first word line contact region, and the first bit line and the second bit line are coupled to the first sense amplifier.

The object and advantages of the invention will be realized and achieved by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A to 4L illustrate an exemplary process for manufacturing memory cells.

FIG. 7 illustrates an exemplary equivalent circuit.

DESCRIPTION OF EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element between the two elements, or one or more intervening elements may also be present.

In the dynamic random access memory (DRAM) cell with the 1-transistor/1-capacitor configuration, two gate electrodes are arranged on one active region and three source/drain regions are formed at a middle and on both the sides, whereby two transistors are formed. The middle source/drain region is used as a common bit-line connection region and the source/drain regions on both the sides are coupled to respective capacitors, whereby two memory cells are formed. With respect to the memory cells arrayed in a matrix pattern, word lines are arranged so as to extend in the column direction and bit lines are arranged so as to extend in the row direction, for example.

In the case of open bit lines, two bit lines arranged in different memory cell areas are coupled to a sense amplifier. An area of each memory cell is reduced, and noise generated in the memory cell area may be imposed on one of the paired bit lines. In the case of folded bit lines, two bit lines arranged in the same memory cell area are coupled to a sense amplifier. A memory cell to be read is coupled to one bit line, while the other bit line, e.g., a reference bit line, may be not coupled to the memory cell to be read. An area of each memory cell is increased, and noise generated in the memory cell area may be imposed on both of the paired bit lines.

Figure 1A:
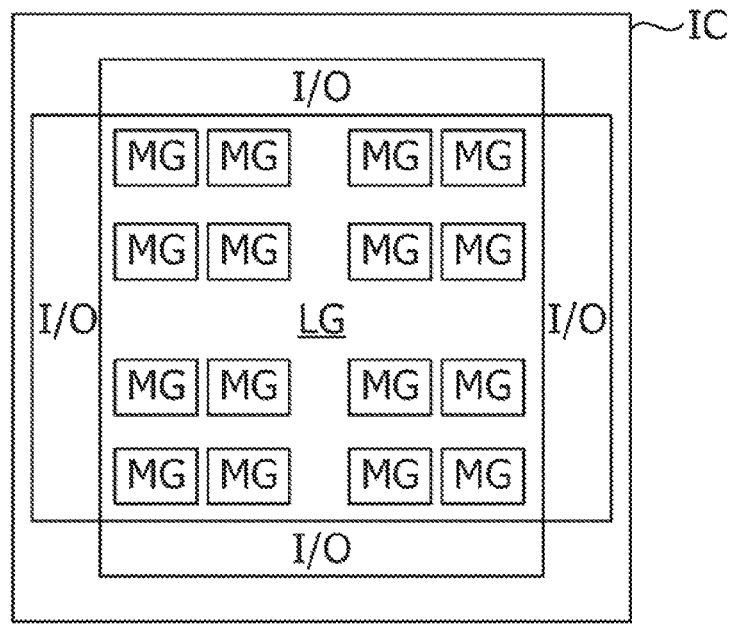
FIG. 1A illustrates an exemplary memory-consolidated logic semiconductor device.

FIG. 1A illustrates an exemplary memory-consolidated logic semiconductor device. FIG. 1A may be a plan view of a memory-consolidated logic semiconductor device IC as illustrated in FIG. 1A. Input/output circuits I/O are arranged in a peripheral portion of the semiconductor device IC. In a central portion of the semiconductor device IC, a logical circuit LG is arranged and memory circuits MG are arranged in a distributed way.

Figure 1B:
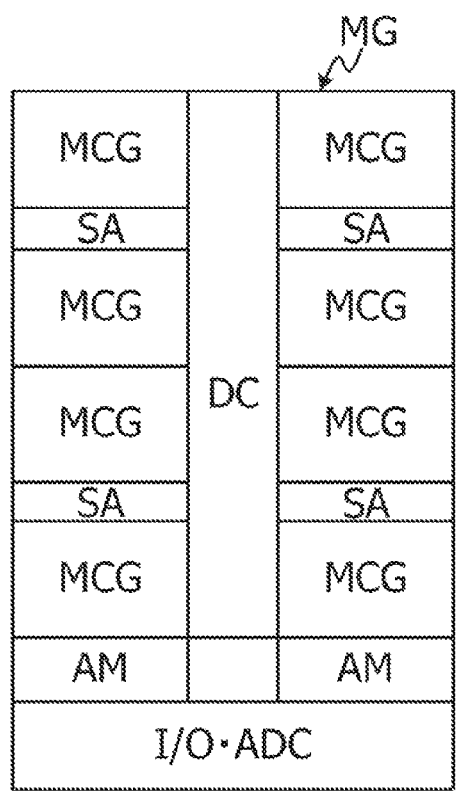
FIG. 1B illustrates an exemplary memory circuit.

FIG. 1B illustrates an exemplary memory circuit. Sense amplifiers SA and memory cell groups MCG are arranged on both the sides of a word decoder DC. A second amplifier AM and an input/output address controller I/O•ADC are arranged at one end, e.g., a lower end as viewed on the drawing, of the word decoder DC.

Figure 1C:
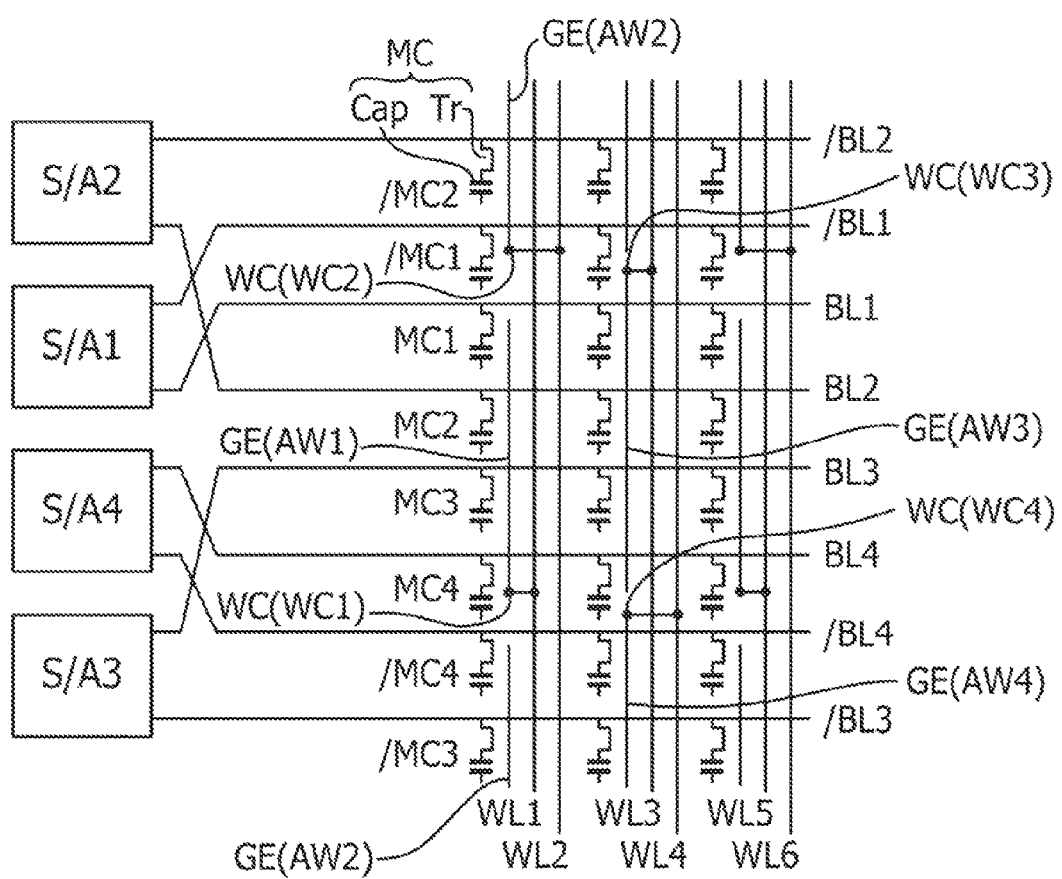
FIG. 1C illustrates an exemplary equivalent circuit.

FIG. 1C illustrates an exemplary equivalent circuit. The equivalent circuit illustrated in FIG. 1C may be an equivalent circuit of the memory cell groups MCG. A memory cell array is formed with memory cells MC arrayed in a matrix pattern. Each of the memory cells MC may be a 1-transistor/1-capacitor memory cell including one access transistor Tr and one capacitor Cap. Each access transistor Tr includes one source/drain region coupled to a bit line BL and a gate electrode GE coupled to a word line WL. The capacitor Cap includes a storage electrode coupled to the other source/drain region of the access transistor Tr.

A plurality of word lines WL extend in the vertical direction, e.g., in the column direction, and are arranged side by side in the horizontal direction, e.g., in the row direction. A plurality of bit lines BL extend in the horizontal direction and are arranged side by side in the vertical direction. The bit lines are cross-wired before being input to the sense amplifier S/A, and a bit line BLi and a reference bit line /BLi corresponding to the bit line BLi are coupled to a common sense amplifier S/Ai. The reference bit line may also be referred as the bit line. Each bit line may extend in the horizontal direction except for the cross-wiring portion.

The memory cell array may be divided into a plurality of areas in the vertical direction, and each area may include four memory cells MC in the vertical direction. A first area including memory cells MC1 to MC4, which are coupled respectively to bit lines BL1 to BL4, and a second area including memory cells /MC4 to /MC1, which are coupled respectively to reference bit lines /BL4 to /BL1 corresponding to the bit lines BL4 to BL1, may be arranged alternately.

The gate electrode GE for four access transistors Tr arranged within the area in the vertical direction is formed of a polysilicon film. The gate electrode GE may be separated by each area. The gate electrodes GE in the first area and the second area are alternately coupled to two metal word lines, e.g., WL1 and WL2. With the gate electrodes GE separated between the first area and the second area, the memory circuit may have the folded bit-line configuration. The word line WL is coupled to the gate electrode GE in a word line contact region WC. The word line contact region WC is disposed at an end of each gate electrode GE.

For example, a memory cell group including the four memory cells MC1 to MC4 shares a gate electrode AW1 serving as, e.g., an auxiliary word line, which extends in the vertical direction. Another memory cell group adjacently positioned above the above-mentioned memory cell group shares another gate electrode AW2 serving as, e.g., an auxiliary word line, which extends in the vertical direction. The auxiliary word line AW1 is coupled to the word line WL1 in a word line contact region WC1 that is disposed at one end, e.g., a lower end, of the auxiliary word line AW1. The auxiliary word line AW2 is coupled to the word line WL2 in a word line contact region WC2 that is disposed at one end, e.g., a lower end, of the auxiliary word line AW2. The auxiliary word line AW3 is coupled to the word line WL3 in a word line contact region WC3 that is disposed at one end, e.g., a higher end, of the auxiliary word line AW3. The auxiliary word line AW4 is coupled to the word line WL4 in a word line contact region WC4 that is disposed at one end, e.g., a higher end, of the auxiliary word line AW4.

Two bit lines adjacent to each other in a sandwiching relation with respect to the word line contact region WC includes a pair of bit line BLi and reference bit line /BLi, and they are coupled to a common sense amplifier S/Ai. For example, the bit line BL4 and the reference bit line /BL4 are adjacent to each other in a sandwiching relation with respect to the word line contact region WC1 and are coupled to a common sense amplifier S/A4.

The two bit lines adjacent to each other in a sandwiching relation with respect to the word line contact region WC may be susceptible to an influence of noise caused by voltage changes in the word line contact region WC. Because the bit line BLi and the corresponding reference bit line /BLi are subjected to substantially the same noise, a noise influence upon a voltage difference between the bit line BLi and the corresponding reference bit line /BLi may be reduced. Therefore, noise generated in the sensing operation may be reduced.

Figure 2A:
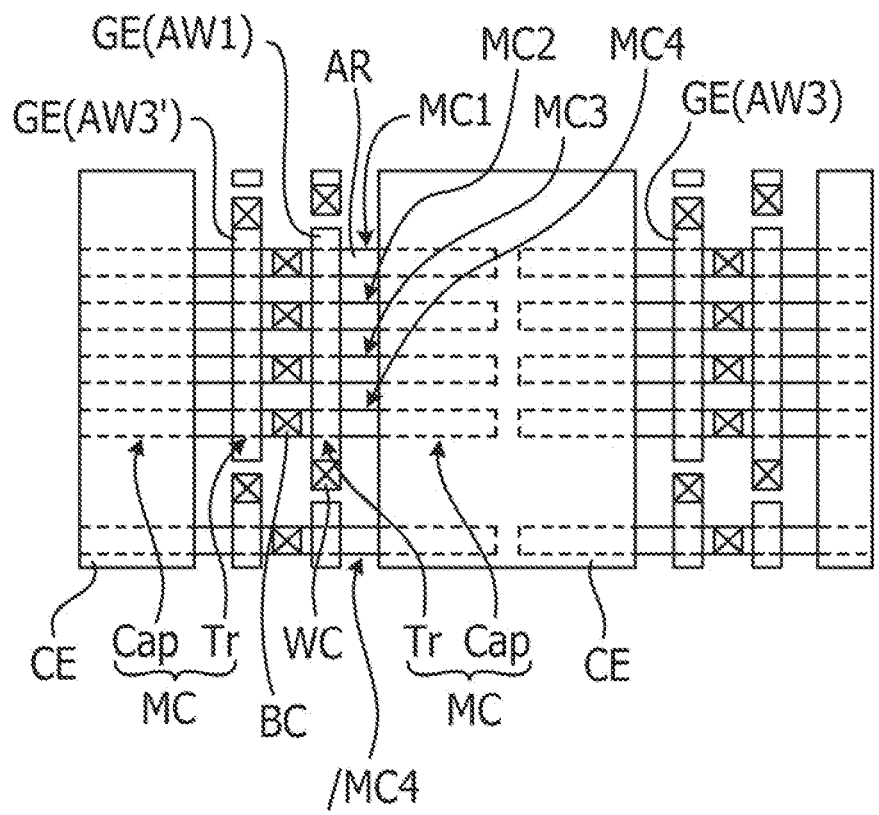
FIGS. 2A, 2B, 2C and 2D illustrate an exemplary memory cell array and an exemplary memory cell.
Figure 2B:
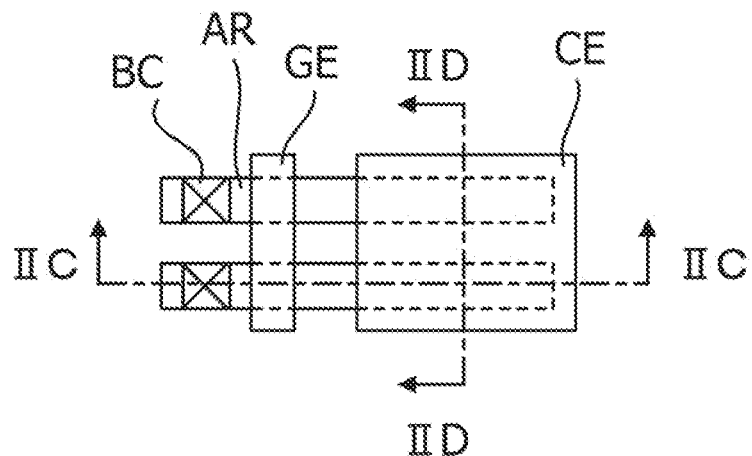

FIGS. 2A, 2B, 2C and 2D illustrate an exemplary memory cell array. FIG. 2A illustrates the layout of the memory cell array as viewed from above. FIG. 2B illustrates part of the layout of the memory cell array as viewed from above. A plurality of elongate active regions AR are arranged in a matrix pattern. The active regions AR are arranged such that the lengthwise direction of each active region AR is oriented in the horizontal direction, e.g., in the row direction, and the active regions AR are arrayed side by side in the vertical direction, e.g., in the column direction, while their horizontal positions are aligned with one another. Columns of the active regions AR are arrayed side by side in the row direction. Vertical positions of the active regions AR arrayed side by side in the row direction are aligned with one another.

Each of the active regions AR includes a bit line contact region BC arranged at a center thereof and memory cells MC which are arranged on both the sides of the bit line contact region BC and each of which has a transistor (portion) Tr and a capacitor (portion) Cap. Transistor gate electrodes GE are arranged on both the sides of the bit line contact regions BC, thereby forming the transistors Tr in areas where the gate electrodes GE intersect the active regions AR. Four transistors arrayed side by side in the vertical direction are continuously formed by each of the gate electrodes GE. Each gate electrode GE has the word line contact region WC at one end thereof in the vertical direction.

The word line contact regions WC are disposed at one end of the gate electrode GE positioned on one side of the bit line contact region BC and at one end of the gate electrode GE positioned on the other side of the bit line contact region BC. For example, a memory cell group including the memory cells MC1 to MC4 and four memory cells, which are arranged on the side opposed to the memory cells MC1 to MC4 with respect to the bit line contact region BC, shares a gate electrode AW3' (FIG. 2A) serving as, e.g., an auxiliary word line. The word line contact region WC located on the auxiliary word line AW1 shared by the memory cell group is disposed at a lower end of the auxiliary word line AW1. The word line contact region WC located on the auxiliary word line AW3' is disposed at an upper end of the auxiliary word line AW3'.

Because of the repeated structure in the horizontal direction, a word line structure coupled to the auxiliary word line AW3' may be substantially the same as or similar to the structure, illustrated in FIG. 1C, of a word line WL3 coupled to an auxiliary word line AW3. In FIG. 1C, the auxiliary word line AW3 is coupled to the word line WL3 in a word line contact region WC3 that is disposed at an upper end of the auxiliary word line AW3.

A pitch between adjacent areas in the vertical direction each of which is included in a different memory cell group, for example, a pitch between the active region AR of the memory cell MC4 at a lower end of the memory cell group including the memory cells MC1 to MC4 and the active region AR of the memory cell /MC4 at an upper end of another memory cell group that is adjacently positioned under the above-mentioned memory cell group may be separated by the gate electrodes GE. For that reason, the word line contact region WC may be disposed in the above-mentioned pitch. Within each area, e.g., within each memory cell group, the active regions AR may be arrayed at a substantially constant pitch, e.g., a minimum pitch, in the vertical direction such that the memory cells may be arrayed at a high density.

An opposite electrode CE of the capacitor portion Cap is formed so as to overlap with respective ends of two adjacent columns of active regions. The capacitor portions Cap of the memory cells MC arranged on one side of one column of active regions and the capacitor portions Cap of the memory cells MC arranged on the other side of another column of active regions, which is adjacent to the active regions, share the opposite electrode CE.

Figure 2C:
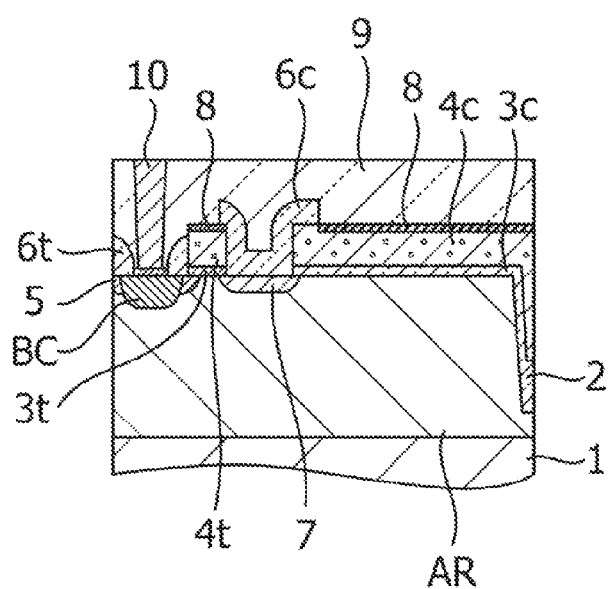
Figure 2D:
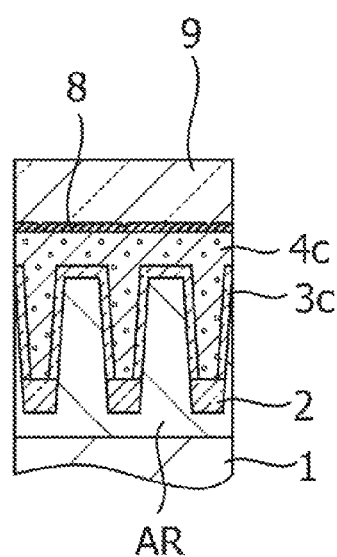

FIG. 2B is a plan view of two memory cells arrayed side by side in the column direction. FIG. 2B illustrates substantially a half of the active region AR in the lengthwise direction thereof, e.g., a part of the active region AR ranging from the bit line contact region BC at a center to one end of the active region AR. FIG. 2C illustrates a cross-section of the active region taken along a line IIC-IIC in FIG. 2B. FIG. 2D illustrates a cross-section of the capacitor portion taken along a line IID-IID in FIG. 2B.

As illustrated in FIG. 2C, the bit line contact region BC may be one n-type (or p-type in a p-type cell) diffusion region formed substantially at a center of a p-type (or n-type in the p-type cell) active regions AR, which is formed on a silicon substrate 1.

A gate insulating film $3t$ is formed on the right side of the bit line contact region BC. A gate electrode $4t$ is formed on the gate insulating film $3t$. The other n-type (or p-type in the p-type cell) diffusion region 7 is coupled to the capacitor on the right side of an insulating gate electrode that includes both the gate insulating film $3t$ and the gate electrode $4t$.

N-type (or p-type in the p-type cell) impurities are ion-implanted into the active regions on both the sides of the insulating gate electrode, thereby forming a bit line contact-side extension (diffusion region) 5 and a capacitor-side extension (diffusion region) 7. A sidewall spacer $6t$ is formed on a sidewall of the gate electrode $4t$, and an insulating film $6c$ covering the capacitor-side extension 7 is formed. The bit line contact region BC having low resistance is formed by subsequent ion implantation.

A capacitor dielectric film $3c$ and an opposite electrode $4c$ are arranged on one side of the capacitor-side diffusion region 7 opposed to the gate electrode $4t$. A silicide region 8 including Co—Si or Ni—Si may be formed on the bit line contact region BC, the gate electrode $4t$, and the opposite electrode $4c$. A lower interlayer insulating film 9 covering the memory cell is deposited and a contact hole is formed by etching to expose the bit line contact region BC. An electrically conductive plug 10, e.g., a tungsten plug, is buried in the contact hole.

As illustrated in FIG. 2D, trenches are formed around the active regions AR, and insulating films 2 for the shallow trench isolation (STI) structure are buried in the trenches. In the capacitor region, the STI insulating films 2 are etched back such that each STI insulating film 2 remains in a certain thickness at the bottom of the trench and a recess is formed so as to expose sidewalls of each active region. The capacitor dielectric film $3c$ is formed on surfaces of the active regions and sidewalls of the active regions, which are exposed to the recesses. The opposite electrode $4c$ is formed on the capacitor dielectric film $3c$. The silicide layer 8 is formed on a surface of the opposite electrode $4c$. In the capacitor portion, when a voltage for turning-on a transistor is applied to the opposite electrode $4c$, a channel is induced to generate a capacitance between the channel and the opposite electrode.

FIGS. 3A to 3G illustrate an exemplary process for manufacturing the memory cells. FIGS. 3A to 3G are each a plan view of a semiconductor substrate.

Figure 3A:
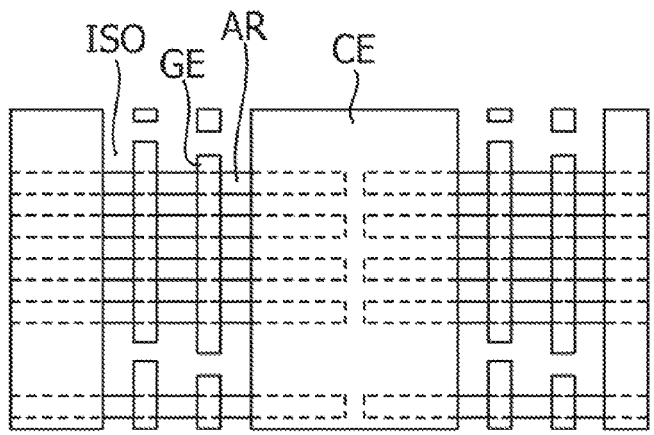
FIGS. 3A to 3G illustrate an exemplary process for manufacturing memory cells.

In FIG. 3A, an element (device) isolation region ISO for defining the active regions AR is formed on the semiconductor substrate. After etching back a region of the opposite electrode CE, an insulating film and a polysilicon film are laminated in the etched-back region. The polysilicon film is patterned to form the gate electrode GE and the opposite electrode CE. Four transistors are successively formed corresponding to one gate electrode GE.

Figure 3B:
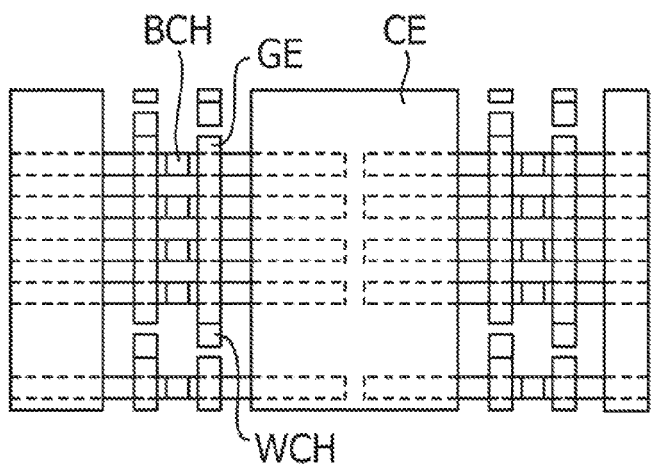

As illustrated in FIG. 3B, the lower interlayer insulating film is formed so as to cover the gate electrode GE and the opposite electrode CE. The lower interlayer insulating film on the bit line contact region BC and the word line contact region WC is etched to form a bit line contact hole BCH and a word line contact hole WCH.

Figure 3C:
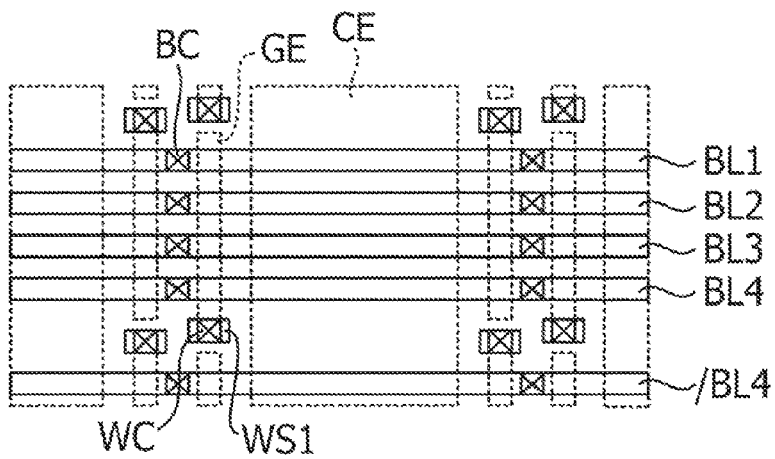

As illustrated in FIG. 3C, a first metal wiring layer is formed on the lower interlayer insulating film. The first metal wiring layer is patterned to form the bit lines BL1 to BL4 and /BL1 to /BL4, which are coupled the active regions AR in the bit line contact regions BC. First word auxiliary wirings WS1 coupled to the word line contact regions WC may be formed contemporaneously. The bit line BL4 and the reference bit line /BL4 are arranged in a sandwiching relation with respect to the word line contact region WC, e.g., the end of the gate electrode GE.

The first metal wiring layer is formed, for example, by laminating a TiN layer, an Al layer, and a TiN layer successively. The first metal wiring layer is patterned by photolithography and dry etching to form the bit lines BL and the first word auxiliary wirings WS1.

Figure 3D:
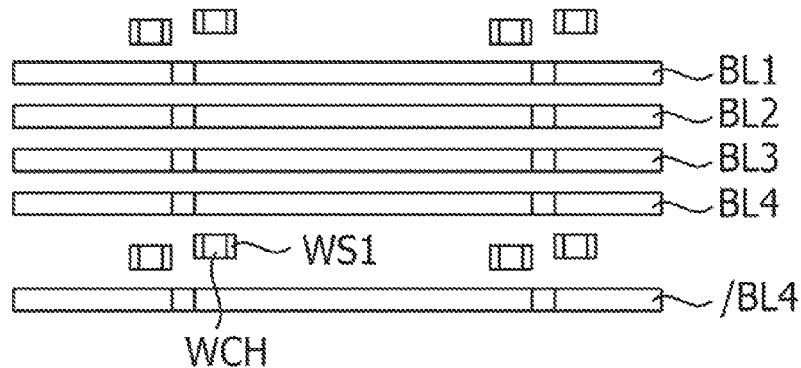

As illustrated in FIG. 3D, the bit lines BL and the first word auxiliary wirings WS1 are covered with a first interlayer insulating film. The first interlayer insulating film is etched to form word line contact holes WCH reaching the first word auxiliary wirings WS1, respectively. Those word line contact holes WCH may be formed by a process that is substantially the same as or similar to the process illustrated in FIG. 3B.

Figure 3E:
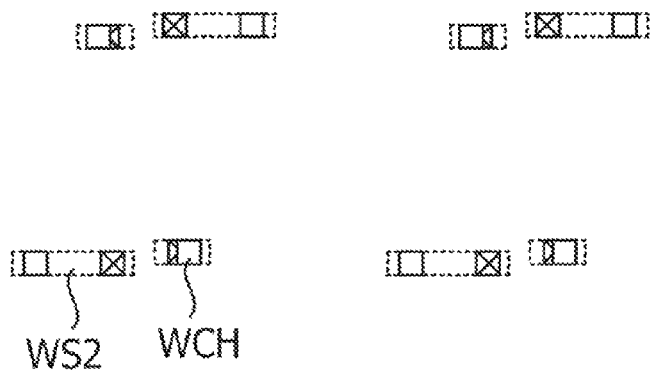

As illustrated in FIG. 3E, a second metal wiring layer is formed on the first interlayer insulating film. The second metal wiring layer is patterned to form second word auxiliary wirings WS2 that are coupled to the first word auxiliary wirings WS1. The second word auxiliary wirings WS2 are covered with a second interlayer insulating film, which is etched to form word line contact holes WCH reaching the second word auxiliary wirings WS2, respectively.

Figure 3F:
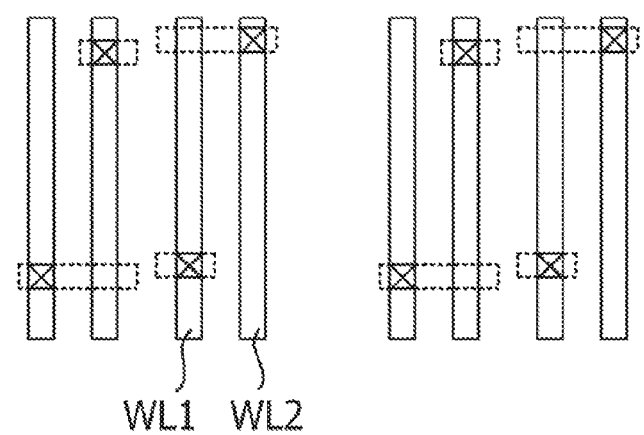

As illustrated in FIG. 3F, a third metal wiring layer is formed on the second interlayer insulating film. The third metal wiring layer is patterned to form the word lines WL that are coupled to the second word auxiliary wirings WS2. The word lines WL are coupled to the gate electrodes GE of the transistors through two stages of the word auxiliary wirings WS2 and WS1.

In the equivalent circuit illustrated in FIG. 1C, the bit lines BL and the reference bit lines /BL are coupled to the sense amplifiers S/A through cross-wirings. The cross-wirings may be formed, for example, by utilizing the second metal wiring layer.

Figure 3G:
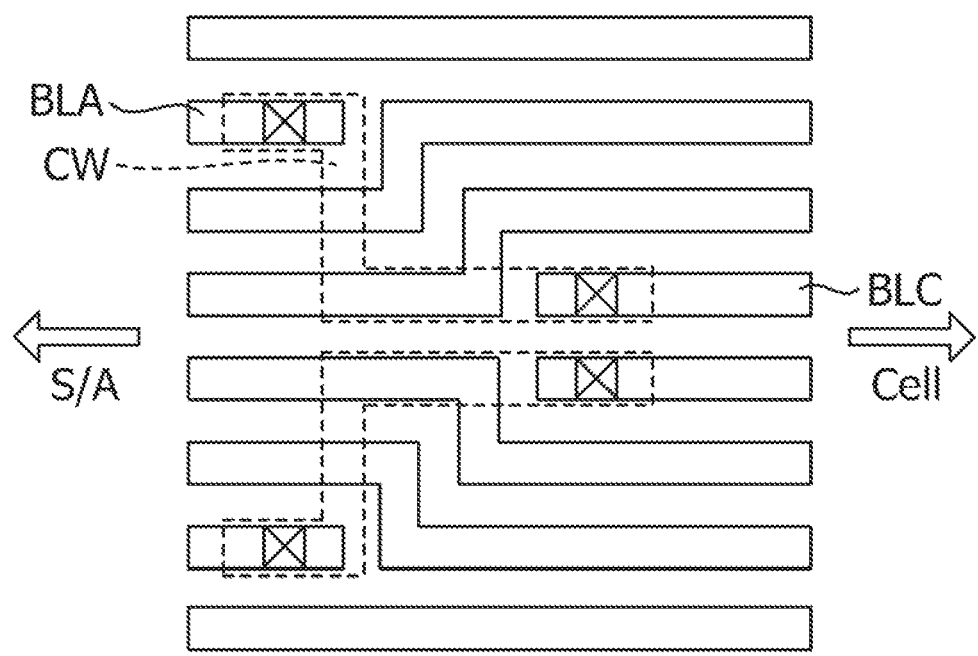

As illustrated in FIG. 3G, auxiliary bit lines CW in the second metal wiring layer are formed such that memory cell-side portions BLC and sense amplifier-side portions BLA of the bit lines in the first metal wiring layer are coupled to each other. Thus, the bit-line cross wirings for coupling the memory cell-side portions BLC to the sense amplifiers S/A are formed. The bit lines, which are not cross-wired, may be directly connected to the sense amplifiers S/A.

Figure 4A:
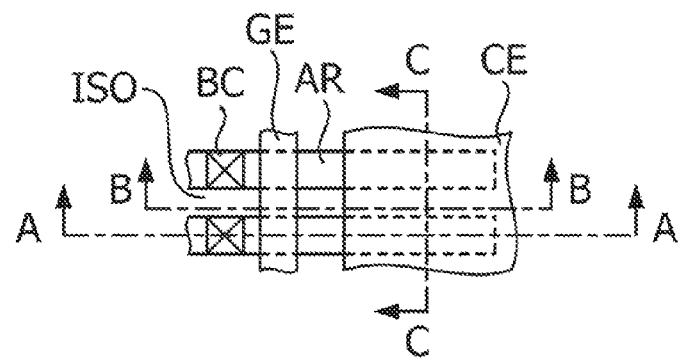

FIGS. 4A to 4L illustrate an exemplary process for manufacturing memory cells. FIG. 4A may be the plan view of the memory cells illustrated in FIG. 2B. The memory cells illustrated in FIG. 4A include two active regions AR arrayed side by side in the vertical direction as viewed on the drawing, two bit contact regions BC, a gate electrode GE for transistor portions, and an opposite electrode CE of a capacitor portion. Each of the active regions AR may have a width of, for example, 70 nm to 110 nm and a length of, for example, 1000 nm to 2000 nm. The active regions AR may be each surrounded by isolation regions ISO of the STI structure. The size of the STI structure between the active regions AR in the widthwise direction may be, for example, 70 nm to 110 nm. The size of the STI structure between the active regions AR in the lengthwise direction may be, for example, 70 nm to 110 nm. Lines A-A, B-B, and C-C in FIG. 4A represent directions of cross-sections illustrated in FIGS. 4B to 4L.

Figure 4B:
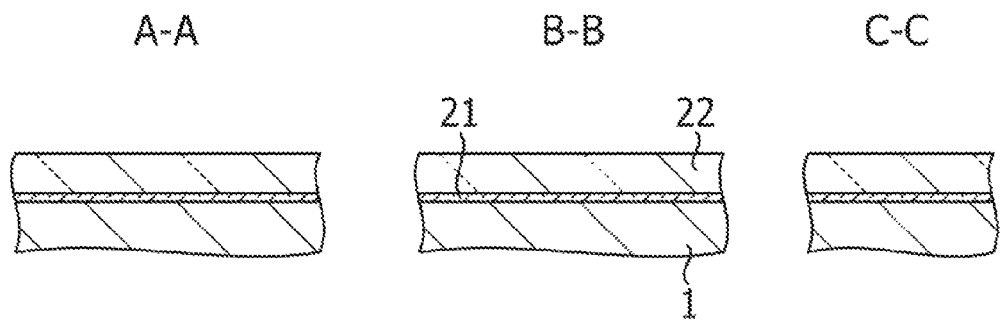

As illustrated in FIG. 4B, the surface of a silicon substrate 1 is thermally oxidized to form a buffer oxide film 21 having a thickness of, for example, 5 nm to 20 nm. On the buffer oxide film 21, a silicon nitride film 22 having a thickness of 50 nm to 200 nm is deposited with thermo-chemical gas-phase deposition (CVD) at 600° C. to 800° C. by using source gases such as a silane-based gas and ammonia. In this stage, the entirety of the silicon substrate may have substantially the same or similar structure.

Figure 4C:
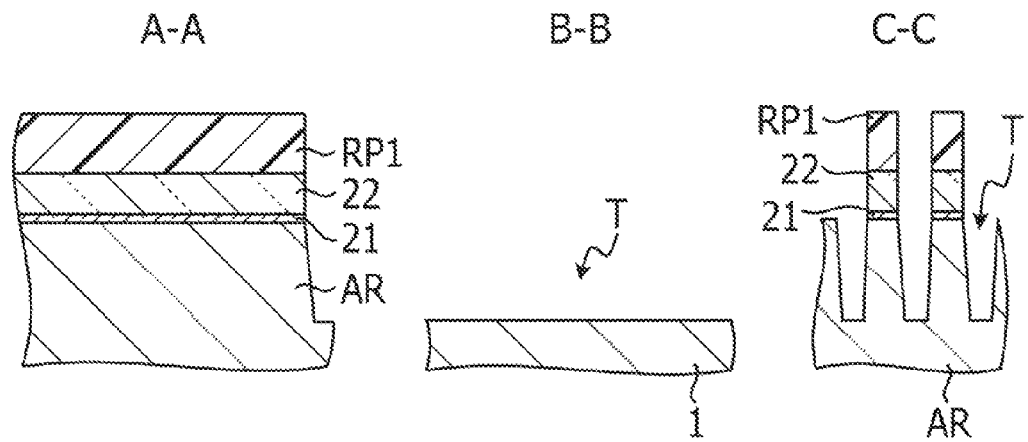

As illustrated in FIG. 4C, a resist pattern RP1 corresponding to the form of the active regions AR are formed on the silicon nitride film 22. The silicon nitride film 22 and the silicon oxide film 21 are patterned by dry etching using an etching gas such as tetraflurocarbon ($CF_4$), thereby forming a hard mask. The resist pattern RP1 may be removed such that only the hard disk remains. Dry etching using etching gases such as hydrogen bromide (HBr) and chlorine ($Cl_2$) are performed on portions of the silicon substrate, which are exposed through the hard mask, thereby forming trenches T which have a depth of about 150 nm to 350 nm and which surround the active regions AR. The resist pattern may be removed, for example, by using a resist removing liquid or by ashing. As illustrated in the C-C cross-section of FIG. 4C, the depth of the trench T may be larger than the width of the active region AR, for example, twice or more than the width of the active region AR.

Figure 4D:
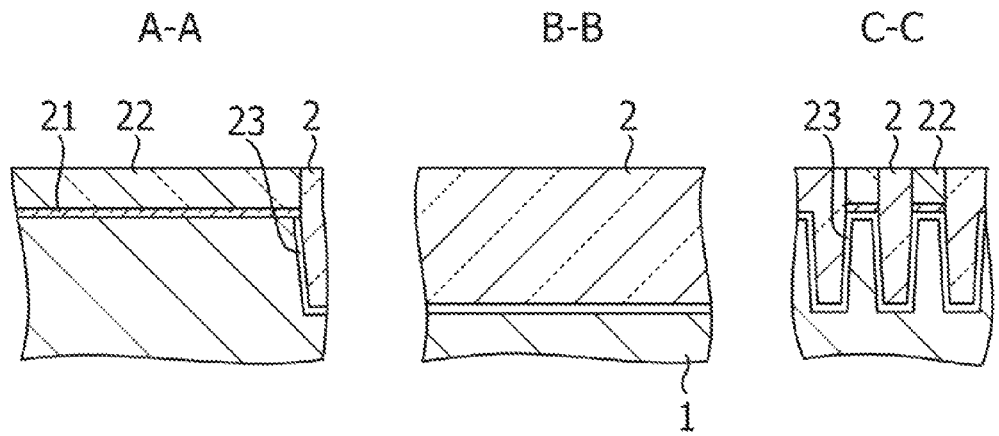

As illustrated in FIG. 4D, a silicon oxide film liner 23 having a thickness of about 2 nm to 10 nm may be formed, as required, on the exposed silicon surface by thermal oxidation. By a high-density plasma (HDP) CVD using a silane-based gas and oxygen, a HDP silicon oxide film may be deposited on the silicon oxide film liner 23. Alternatively, by CVD using tetraethoxysilane (TEOS) and oxygen, a TEOS silicon oxide film (hereinafter referred to simply as a "silicon oxide film 2") may be deposited thereon. The trenches are filled back with the deposition. Chemical mechanical polishing (CMP) is performed on the substrate from above to expose the silicon nitride film 22 that serves as a CMP stopper. The silicon oxide film liner 23 may be omitted from some drawings described below.

Figure 4E:
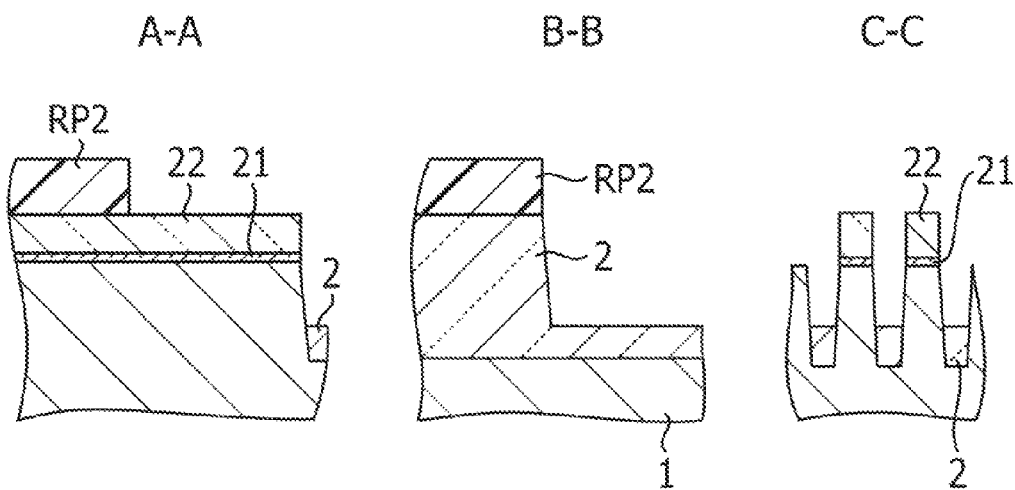

As illustrated in FIG. 4E, a resist pattern RP2 is formed which has an opening in substantially the same or similar shape as or to that of the opposite electrode CE illustrated in FIG. 4A. The silicon oxide film 2 exposed in the opening is etched by using, e.g., hexafluorobutadiene ($C_4F_6$) as an etching gas such that a part of the silicon oxide film 2 having a thickness of 50 nm to 150 nm remains at the bottom for the purpose of element isolation. Sidewalls of the active regions are thereby exposed. The silicon nitride film 22 may be used as an etching mask. Thereafter, the resist pattern RP2 may be removed.

Figure 4F:
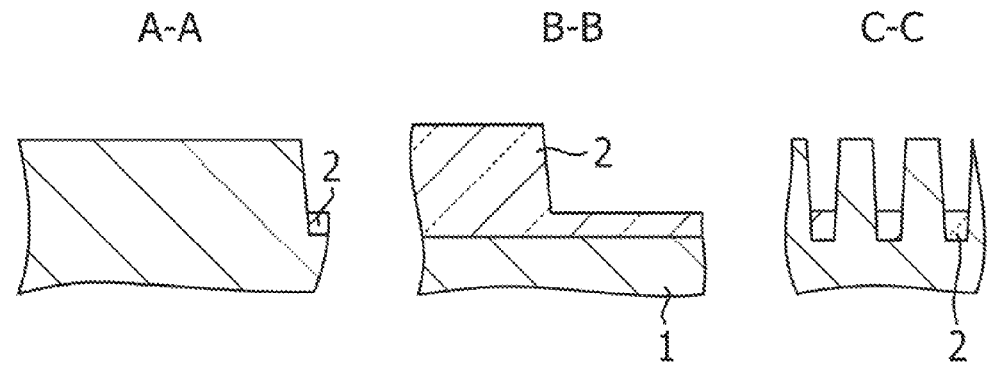

As illustrated in FIG. 4F, the silicon nitride film 22 is washed out by boiling in phosphoric acid or in a mixed solution of phosphoric acid and fluoric acid. The silicon oxide film 21 is washed out with diluted fluoric acid or the above-mentioned mixed solution. The (TEOS) silicon oxide film 2 may be etched and a most part of the silicon oxide film 2 may be left.

As illustrated in FIG. 4G, the exposed silicon surface is thermally oxidized to form a sacrifice silicon oxide film 24 having a thickness of 5 nm to 10 nm for the purpose of ion implantation.

As illustrated in FIG. 4H, ion implantation of p-type impurities (or n-type impurities in the p-type cell) is performed into the silicon substrate through the sacrifice silicon oxide film 24 a plurality of times while acceleration energy is changed, thereby forming a p-type well PW (or n-type well NW in the p-type cell). Thereafter, the sacrifice silicon oxide film 24 may be removed.

As illustrated in FIG. 4I, the exposed silicon surface is cleaned or thermally oxidized to form a gate oxide film 3 having a thickness of about 2 nm to 7 nm. A polycrystalline silicon film 4 having a thickness of about 70 nm to 150 nm is deposited on the gate oxide film 3 by thermal CVD using a silane-based gas and hydrogen while the substrate temperature is set to 400° C. to 750° C. After depositing amorphous silicon, crystallizing may be performed with heat treatment.

A resist pattern RP3 corresponding to the shapes of the gate electrode and the opposite electrode is formed on the polycrystalline silicon film 4. The pattern for the opposite electrode may have substantially the same size as an opening that is used to form a recess for the capacitor. The thickness of the polycrystalline silicon film 4 may be set to such a value as enough to fill back the trenches T. The polycrystalline silicon film 4 is etched with the resist pattern RP3 used as an etching mask, whereby the gate electrode and the opposite electrode are patterned. Thereafter, the resist pattern RP3 may be removed. A hard mask may be formed by forming, e.g., a silicon nitride film under the resist pattern RP3.

Figure 4J:
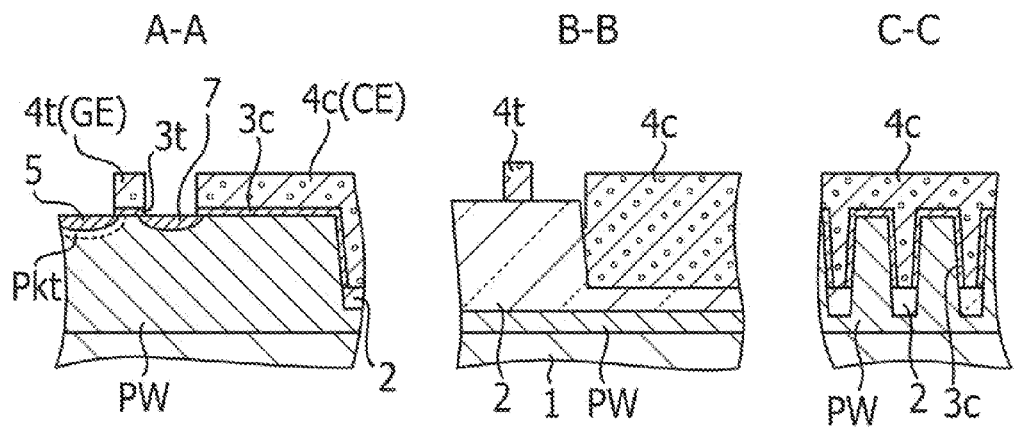

As illustrated in FIG. 4J, the extensions 5 and 7 are formed by ion-implanting n-type impurities, such as As, (or p-type impurities, such as B, in the p-type cell) with the gate electrode 4t (GE) and the opposite electrode 4c (CE) used as masks. A p-type pocket region Pkt surrounding the n-type extension 5 may be formed by oblique ion-implanting p-type impurities, such as In, while the capacitor-side extension 7 is covered with a resist mask. In the case of the p-type cell, an n-type pocket region may be formed by ion-implanting n-type impurities, such as P. The pocket region may be of the same conductivity type as the well, and it may be omitted from some drawings. Ion implantation may not be performed on the active region in the capacitor portion, which is covered with the opposite electrode CE. The implanted impurities are activated by performing rapid thermal annealing (RTA) for a time period from a time not longer than 1 sec to about 15 sec on condition that temperature is set to 900° C. to 1100° C.

Figure 4K:
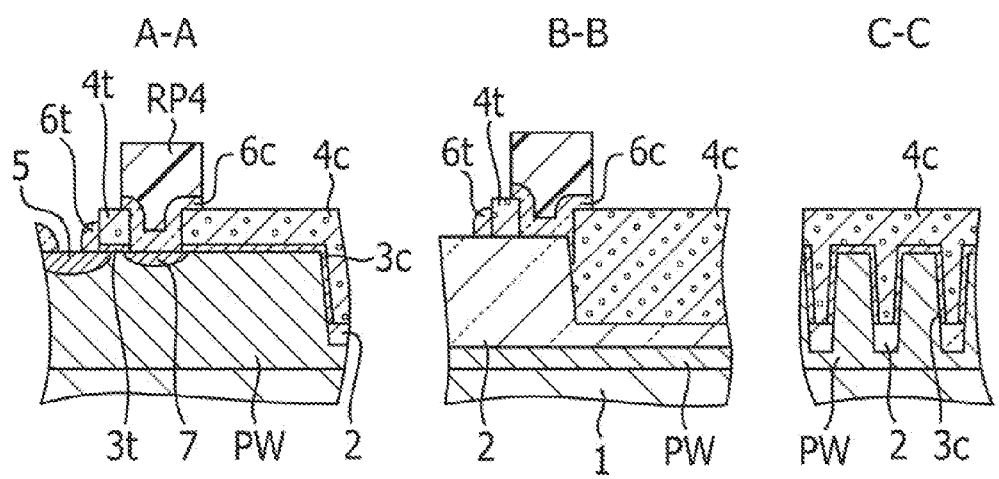

As illustrated in FIG. 4K, an insulating film including silicon oxide or silicon nitride and having a thickness of about 30 nm to 80 nm is deposited on the semiconductor substrate so as to cover the gate electrode 4t and the opposite electrode 4c. The extension 7 between the gate electrode 4t and the opposite electrode 4c is covered with a resist pattern RP4. Anisotropic etching, such as reactive ion etching, is performed such that the sidewall spacer 6t is left on the sidewall of the gate electrode 4t on the bit line contact side thereof, and that the insulating film 6c covering the capacitor-side extension 7 is left. Thereafter, the resist pattern RP4 may be removed. A known sidewall spacer, including a multilayer sidewall spacer, may be formed.

Figure 4L:
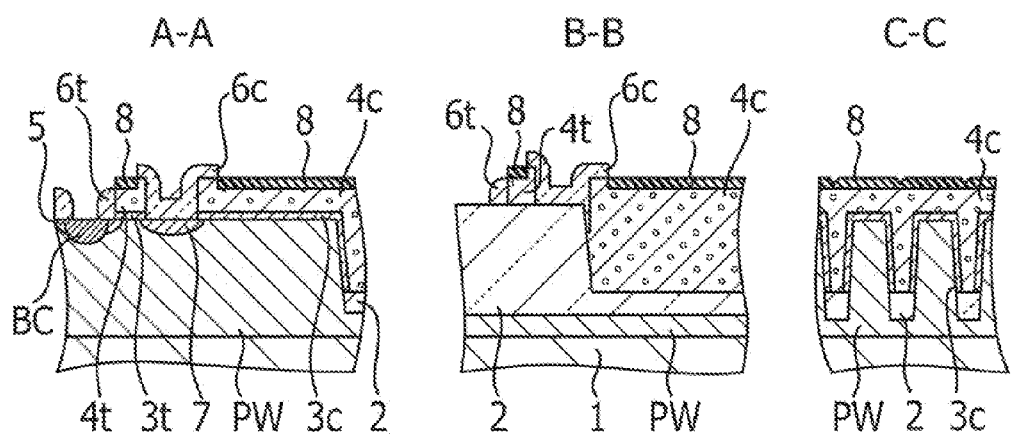

As illustrated in FIG. 4L, the bit line contact region BC having low resistance is formed by masking the sidewall spacer 6t and the insulating film 6c, and then ion-implanting n-type impurities, such as P, (or p-type impurities, such as B, in the p-type cell). An activation process may also be performed as required. After removing an oxide film on the silicon surface, a Co film or a Ni film is formed on the substrate surface by sputtering, for example, and is changed to a silicide film with heat treatment. A silicide film 8 is formed by washing out unreacted film portions and by performing the heat treatment again as required.

Thus, the memory cells are formed as illustrated in FIGS. 4A to 4L. When the memory cells are integrated together with a CMOS logic circuit, the access transistors of the memory cells may be formed in processes common to NMOS (or PMOS in the p-type cell) transistors of the logic circuit. The transistor and the capacitor are coupled to each other by a channel formed on the surface of the silicon substrate when a certain potential is applied to the polysilicon layer (opposite electrode) 4c that is formed in the capacitor region. Impurities may be implanted to the surface of the silicon substrate in the capacitor region such that the source and the drain of the transistor are electrically coupled to each other. Thereafter, a lower interlayer insulating film may be formed so as to cover the memory cells and the MOS transistors of the logic circuit. The structure illustrated in FIG. 2C may be formed by filling an electrically conductive plug in the contact hole that has been formed by etching.

Multilayer wirings may be formed as disclosed in U.S. Pat. No. 6,949,830, for example.

Figure 5A:
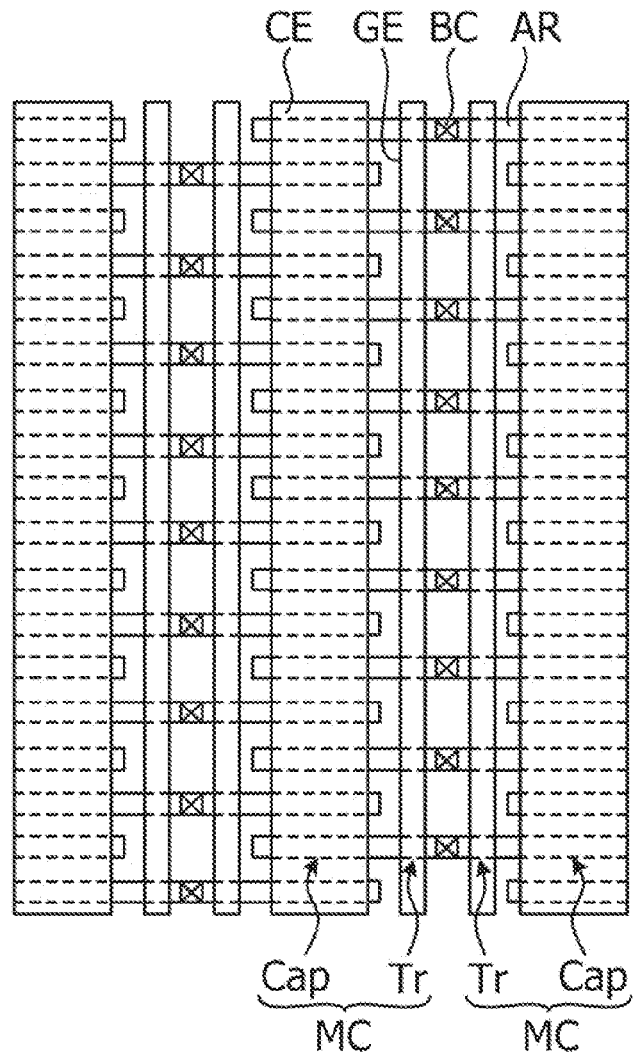
FIGS. 5A and 5B illustrate an exemplary memory cell array.
Figure 5B:
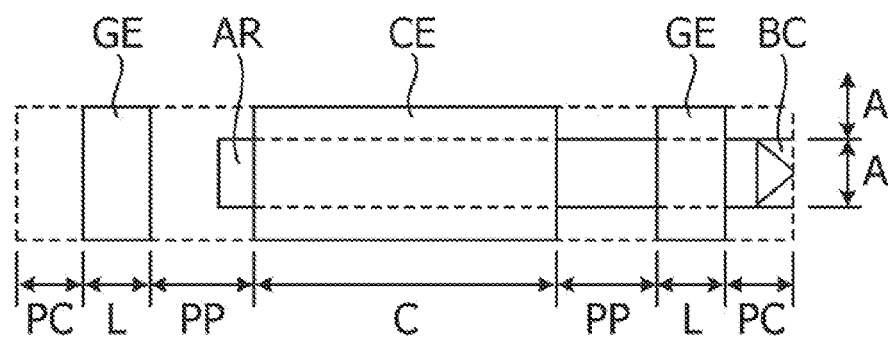

FIGS. 5A and 5B illustrate an exemplary memory cell array. FIG. 5A is a plan view of a memory cell array of the type using folded bit lines. A plurality of elongate active regions AR are arrayed at a substantially constant pitch in the vertical direction with the lengthwise direction of each active region being oriented in the horizontal direction. The active regions AR arrayed side by side in the vertical direction are arranged such that their positions are alternately shifted in the left and right direction.

One active region AR includes a bit line contact region BC arranged at a center and memory cells MC which are arranged on both the sides of the bit line contact region BC and each of which has a transistor (portion) Tr and a capacitor (portion) Cap. An opposite electrode CE is arranged so as to overlap with respective parts of the active regions AR while respective ends of the active regions AR are left in a not-overlapped state. The capacitor portions Cap are arrayed side by side in the column direction with their positions in the row direction aligned with one another. The bit line contact regions BC are arranged to be alternately located on the left side and the right side of the capacitor portions Cap. Transistor gate electrodes GE are arranged on both the sides of the bit line contact regions BC, thereby forming the transistors Tr in areas where the gate electrodes GE intersect the active regions AR.

FIG. 5B illustrates an exemplary memory cell region. Assuming that the width (gate length) of the gate electrode GE is L, the length of the overlap between the opposite electrode CE and the active region AR is C, the pitch between the gate electrode GE and the opposite electrode CE is PP, the pitch between the center of the bit line contact region BC and the gate electrode GE is PC, and the width of the active region AR and an element isolation width are each A, a cell area illustrated in FIGS. 5A and 5B is expressed by the following formula:

$$2A \times (2PC + 2PP + 2L + C) \quad (1)$$

Figure 6:
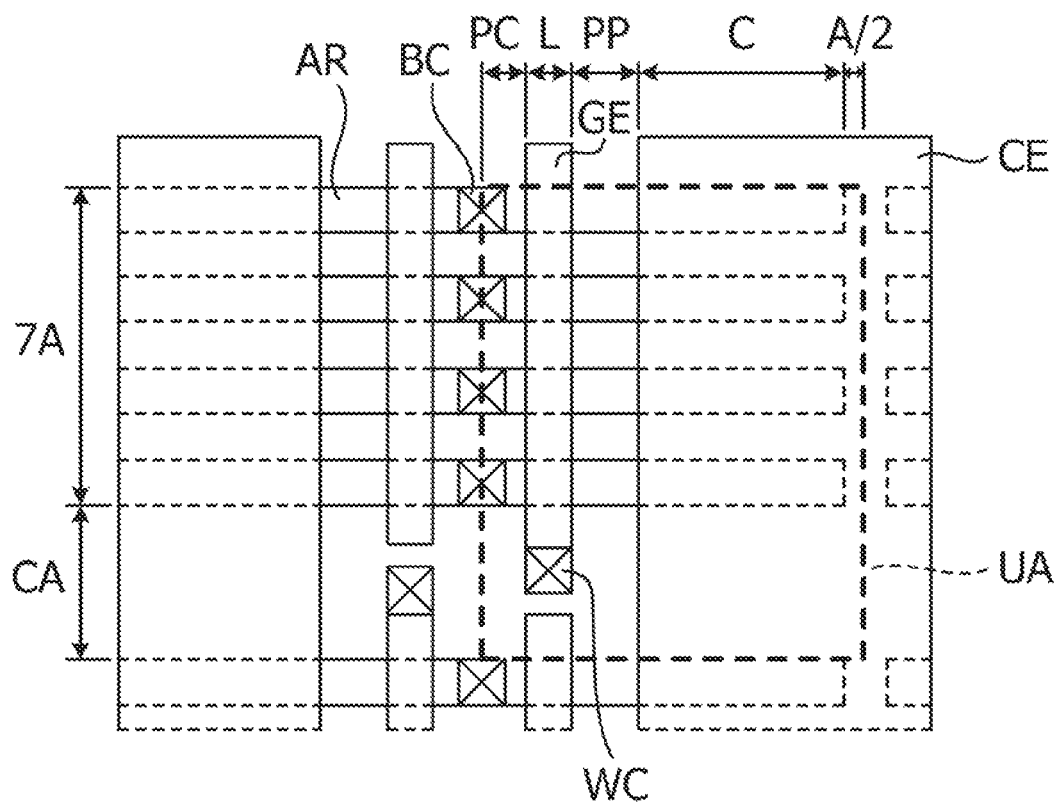
FIG. 6 illustrates one example of an exemplary memory cell array.

FIG. 6 illustrates an exemplary memory cell array. A region UA includes four memory cell regions. Assuming that the pitch between the adjacent active regions AR in different areas is CA, the length of the region UA in the vertical direction is expressed by (7A+CA) and the length of the region UA in the horizontal direction is expressed by (PC+L+PP+C+A/2) based on the definition of the various lengths illustrated in FIG. 5B. Accordingly, a cell area is expressed by the following formula:

$$(7A+CA) \times (PC+L+PP+C+A/2)/4 \quad (2)$$

The length (spacing) CA is longer than the pitch A between the adjacent active regions AR in the area, for example, the element isolation width. An allowable amount by which the gate-electrode polysilicon layer projects toward the word line contact region WC from the active region AR positioned at the end of the area may be about A in consideration of both rounding of a distal end portion of the gate-electrode polysilicon layer, which may be about A/2, and a positional deviation of the distal end portion, which is may be about A/2 together. The pitch between the gate-electrode polysilicon layers separated from each other may be about A. Further, in the first metal wiring on the upper layer, the length between the bit line and the first word auxiliary wiring may be about A.

The overlap between the wiring coupled to the word line contact region WC and the coupled gate-electrode polysilicon layer may be about A/2, and the length between the wiring coupled to the word line contact region WC and the not-coupled gate-electrode polysilicon layer may be about the above-mentioned positional deviation, i.e., about A/2. The length CA may be about 3.5A.

A cell area of the memory cell, illustrated in FIG. 6, is expressed by the following formula:

$$2.625A \times (PC+L+PP+C+A/2) \quad (2)'$$

The difference between the cell area of the memory cell illustrated in FIG. 5 and the cell area of the memory cell illustrated in FIG. 6 is expressed by the following formula:

$$1.375A \times (PC+PP+L) - A \times (0.625C+1.3125A) \quad (3)$$

Thus, the magnitude of the cell area may depend on the relationship in magnitude between the added length of PC, PP and L and C.

In the case of A=0.1 μm, PC=0.1 μm, L=0.1 μm, PP=0.15 μm, and C=0.45 μm, for example, the cell area of the memory cell illustrated in FIG. 5 may be 0.230 μm² and the cell area of the memory cell illustrated in FIG. 6 may be 0.225 μm².

A twist structure may be employed, and the array of the bit lines, including the reference bit lines, may be changed.

FIG. 7 illustrates an exemplary bit line array. In FIG. 7, the bit line array illustrated in FIG. 1C is represented on the left side of a twist portion TW, i.e., on the sense amplifier side, and cross-wiring is performed in the twist portion TW to provide a bit line array represented on the right side of the twist portion TW.

In the bit line array illustrated in FIG. 1C, for example, on the left side of the twist portion TW, the bit line BL1 may be adjacent to the reference bit line /BL1. Because the reference bit line generates no noise, noise generated in the bit line BL1 may be reduced. Because the bit line BL2, for example, is adjacent to the other bit lines BL1 and BL3, noise generated in the bit line BL2 may not be reduced.

Through the twist structure, the bit line BL2 is made adjacent to both the reference bit line /BL2 and the reference bit line /BL1 on the right side of the twist portion TW. The reference bit line /BL2 may generate no noise. The bit line BL2 is adjacent to the bit line BL1 and the reference bit line /BL1 on the left side and the right side of the twist portion TW, respectively. Because noises are generated in the bit line BL1 and the reference bit line /BL1 in opposed directions, those noises may be cancelled.

In the bit line array illustrated in FIG. 1C, for example, on the left side of the twist portion TW, the word line contact regions WC are arranged between the bit line BL1 and the reference bit line /BL1, or between the bit line BL4 and the reference bit line /BL4. The word line contact regions WC may be not arranged between the bit line BL2 and the reference bit line /BL2, or between the bit line BL3 and the reference bit line /BL3.

On the right side of the twist portion TW, the word line contact regions WC are arranged between the bit line BL2 and the reference bit line /BL2, or between the bit line BL3 and the reference bit line /BL3. Through the twist structure, the pair of bit line and reference bit line adjacent to each other in a sandwiching relation with respect to the word line contact regions WC may be replaced by another pair. Noises in the sensing operation may be reduced in the bit line and the reference bit line, which adjacent to each other in a sandwiching relation with respect to the word line contact regions WC, as illustrated in FIG. 1C.

Figure 8A:
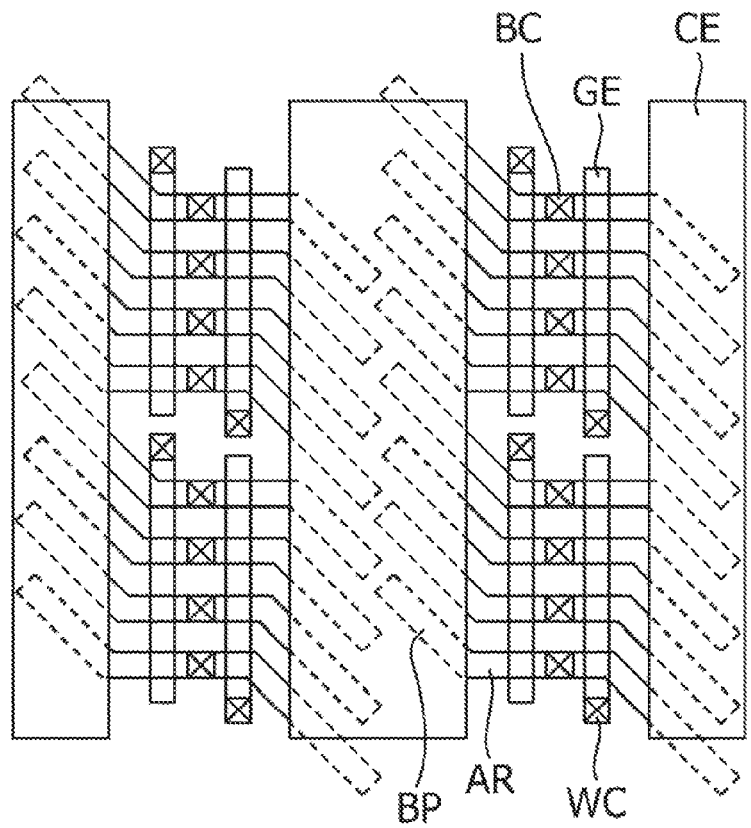
FIGS. 8A and 8B illustrate an exemplary memory cell array and an exemplary memory cell.
Figure 8B:
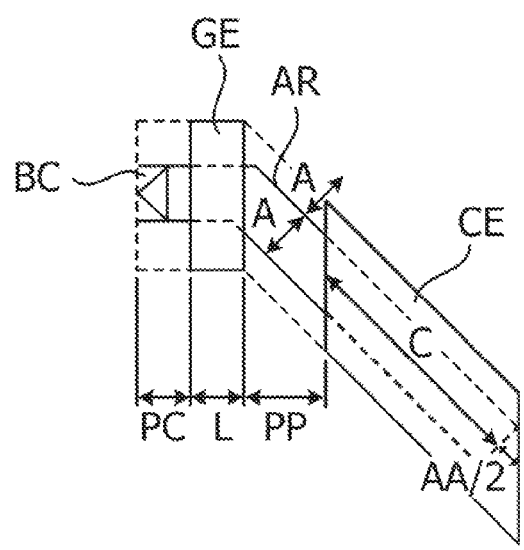

FIGS. 8A and 8B illustrate an exemplary memory cell array. FIG. 8A is a plan view of the memory cell array. Each active region AR may have a shape bent at both end ends thereof. Each active region AR illustrated in FIG. 2A has a shape extending straightforward in the horizontal direction. In FIG. 2A, there is a wide area under the opposite electrode CE between the active regions AR which are adjacent to each other, but they belong to different areas. The array efficiency of the capacitor portions may be increased by forming active regions in such a wide area.

In FIG. 8A, four active regions AR are arrayed side by side at a substantially constant pitch in the vertical direction within the area in a portion where the active regions AR extend horizontally. The pitch between the adjacent active regions AR belonging to different areas may be wide enough to arrange the word line contact regions WC in that pitch.

A right end portion of each active region AR is bent downwards as viewed on the drawing, and a left end portion of each active region AR is bent upwards as viewed on the drawing. A portion of the active region AR ranging from its bent point to its end may be referenced as a "bent portion BP". The bent portion BP extends under the opposite electrode CE. Under the opposite electrode CE, the bent portions BP of the active regions AR are arrayed at a substantially constant pitch parallel to one another in a direction perpendicular to the direction in which the bent portions BP extend. A column of the active regions AR may be arranged such that their horizontal positions, e.g., respective ends of the bent portions, are aligned with one another. A row of the active regions AR may be arranged such that vertical positions of their horizontally extending positions are aligned with one another.

An angle at which each bent portion BP is bent from the horizontal direction may be larger than 0°, but smaller than 90°. For example, the bent angle may be in the range of about 30° to 50°. The direction in which each bent portion BP extends may differ from the horizontal direction and the vertical direction. Respective horizontal positions of the bent points are shifted for each active region AR such that the bent portions BP are arrayed at a substantially constant pitch under the opposite electrode CE. Accordingly, the capacitor portions may be arrayed at a minimum pitch, for example.

FIG. 8B illustrates the memory cell of the memory cell array illustrated in FIG. 8A. Assuming, for example, that the width of the gate electrode GE, i.e., the gate length, is L, the length of the overlap between the opposite electrode CE and the active region AR (at its center in the widthwise direction) is C, the pitch between the gate electrode GE and the opposite electrode CE is PP, the pitch between the center of the bit line contact region BC and the gate electrode GE is PC, the width of the active region AR under the opposite electrode CE and the element isolation width are each A, the pitch between the active region AR adjacent to each other in the lengthwise direction thereof under the opposite electrode CE is AA, and the bent angle is 45°, a cell area is expressed by the following formula:

$$2A \times (\sqrt{2}(PC+L+PP)+C+AA/2) \qquad (4)$$

In the case of A=0.1 μm, AA=0.1 μm, PC=0.1 μm, L=0.1 μm, PP=0.15 μm, and C=0.45 μm, for example, the cell area may be 0.199 μm².

The number of access transistors sharing the gate electrode, e.g., the number of memory cells arrayed side by side in the vertical direction within one area, may be arbitrarily selected.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A method of manufacturing a semiconductor storage device, the method comprising:
    forming element isolation trenches in a semiconductor substrate, the element isolation trenches identifying active regions arranged in a matrix pattern extending in a first direction and a second direction, each of the active regions including a transistor region and a capacitor region;
    filling the element isolation trenches with an element isolation insulating film;
    removing at least a part of the element isolation insulating film in the element isolation trenches provided on both sides of the capacitor region to expose a sidewall of at least one of the active regions;
    forming a dielectric film and a first conductive film on the at least one active regions and on the sidewall of the at least one of the active regions;
    etching the first conductive film to form first conductive patterns in the transistor region which is divided in units of the plurality of active regions arranged side by side in the second direction;
    forming a second conductive pattern in the capacitor regions;
    forming a lower interlayer insulating film to cover the first conductive pattern and the second conductive pattern;
    forming a first wiring layer on the lower interlayer insulating film; and
    forming first patterns adjacent to each other, one end of the divided first conductive pattern being provided between the first patterns.

2. The method of manufacturing the semiconductor storage device according to claim 1, further comprising:
    forming an interlayer insulating film on the first patterns; and forming, on the interlayer insulating film, a second pattern which is coupled to the one end of the divided first conductive pattern and which extends in the second direction.

3. The method of manufacturing the semiconductor storage device according to claim 1, further comprising:
   forming a third pattern in the first wiring layer, the third pattern is coupled to the one end of the divided first conductive pattern;
   forming a first interlayer insulating film to cover the first patterns and the third pattern;
   forming a second wiring layer on the first interlayer insulating film;
   forming a fourth pattern in the second wiring layer, the fourth pattern is coupled to the third pattern:
   forming a second interlayer insulating film to cover the fourth pattern;
   forming a third wiring layer on the second interlayer insulating film; and
   forming a fifth pattern coupled to the fourth pattern.

4. The method of manufacturing the semiconductor storage device according to claim 1, further comprising forming another first pattern on the first patterns to form cross-wiring.

5. The method of manufacturing the semiconductor storage device according to claim 1, wherein the first conductive pattern includes a gate electrode, and the second conductive pattern includes an opposite electrode.

6. The method of manufacturing the semiconductor storage device according to claim 2, wherein the first pattern includes a bit line, and the second pattern includes a word line.

* * * * *